United States Patent
Ryu et al.

(10) Patent No.: US 11,251,135 B2
(45) Date of Patent: Feb. 15, 2022

(54) ELECTRONIC DEVICE MODULE AND METHOD OF MANUFACTURING THE SAME

(71) Applicant: Samsung Electro-Mechanics Co., Ltd., Suwon-si (KR)

(72) Inventors: Jong In Ryu, Suwon-si (KR); Suk Youn Hong, Suwon-si (KR); Gi Su Chi, Suwon-si (KR); Seung Hyun Hong, Suwon-si (KR); Ki Chan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 251 days.

(21) Appl. No.: 16/181,404

(22) Filed: Nov. 6, 2018

(65) Prior Publication Data
US 2019/0304926 A1     Oct. 3, 2019

(30) Foreign Application Priority Data

Apr. 2, 2018  (KR) .......................... 10-2018-0038279
May 31, 2018 (KR) .......................... 10-2018-0062933

(51) Int. Cl.
*H01L 23/552*     (2006.01)
*H01L 23/538*     (2006.01)
(Continued)

(52) U.S. Cl.
CPC .......... *H01L 23/552* (2013.01); *H01L 21/565* (2013.01); *H01L 23/3121* (2013.01);
(Continued)

(58) Field of Classification Search
CPC . H01L 23/552; H01L 23/556; H01L 23/3121; H01L 23/3128; H01L 21/565;
(Continued)

(56) References Cited

U.S. PATENT DOCUMENTS 5,218,234 A * 6/1993 Thompson .............. H01L 21/56
                                                      257/787
5,900,669 A * 5/1999 Knapp ................ H01L 23/3121
                                                      257/701
(Continued)

FOREIGN PATENT DOCUMENTS

CN        101525467 A  *  9/2009
JP         4175351 B2    11/2008
JP         5844439 B2     1/2016

OTHER PUBLICATIONS

Armstrong et al., "Advanced PCB design and layout for EMC Part 2—Segregation and Interface Suppression", EMC Compliance Club, http://www.nutwooduk.co.uk/pring_article.aspx?artid=109, May 4, 2010, pp. 1-25 (Year: 2010).*
(Continued)

*Primary Examiner* — Vincent Wall
(74) *Attorney, Agent, or Firm* — NSIP Law

(57) ABSTRACT

An electronic device module includes a substrate, at least one first component and at least one second component disposed on one surface of the substrate, a second sealing portion having the at least one second component embedded therein, and disposed on the substrate, and a first sealing portion disposed outside of the second sealing portion, at least a portion of the first sealing portion being disposed between the at least one first component and the substrate.

18 Claims, 6 Drawing Sheets

(51) Int. Cl.
  *H01L 23/31* (2006.01)
  *H01L 25/00* (2006.01)
  *H01L 21/56* (2006.01)
  *H01L 25/16* (2006.01)
  *H01L 23/66* (2006.01)

(52) U.S. Cl.
  CPC ...... *H01L 23/5383* (2013.01); *H01L 23/5386* (2013.01); *H01L 23/66* (2013.01); *H01L 25/16* (2013.01); *H01L 25/50* (2013.01); *H01L 2223/6677* (2013.01)

(58) Field of Classification Search
  CPC ... H01L 25/105; H01L 25/50; H01L 23/3135; H01L 2924/1815
  See application file for complete search history.

(56) References Cited

U.S. PATENT DOCUMENTS

| | | | | |
|---|---|---|---|---|
| 6,940,183 | B1* | 9/2005 | Hwan | H01L 23/3121 |
| | | | | 257/666 |
| 9,818,722 | B1* | 11/2017 | Wang | H01L 24/19 |
| 9,859,232 | B1* | 1/2018 | Chiang | H01L 23/552 |
| 2006/0244142 | A1* | 11/2006 | Waidhas | H01L 24/13 |
| | | | | 257/738 |
| 2008/0128885 | A1* | 6/2008 | Lee | H01L 24/05 |
| | | | | 257/690 |
| 2008/0286688 | A1* | 11/2008 | Koyanagi | G03F 7/038 |
| | | | | 430/285.1 |
| 2010/0032579 | A1* | 2/2010 | Chen | G01T 1/24 |
| | | | | 250/370.13 |
| 2013/0020665 | A1* | 1/2013 | Oganesian | H01L 27/14618 |
| | | | | 257/432 |
| 2013/0087896 | A1* | 4/2013 | Chou | H01L 23/36 |
| | | | | 257/659 |
| 2016/0218420 | A1 | 7/2016 | Leung et al. | |
| 2016/0240493 | A1 | 8/2016 | Lee et al. | |
| 2017/0077039 | A1 | 3/2017 | Liao et al. | |
| 2018/0090449 | A1* | 3/2018 | Jeong | H01L 23/3157 |
| 2019/0103365 | A1 | 4/2019 | Singh et al. | |
| 2019/0181021 | A1* | 6/2019 | Wang | H01L 24/06 |

OTHER PUBLICATIONS

CN-101525467-A machine translation (Year: 2021).*
United States Office Action dated Jul. 26, 2021, in related U.S. Appl. No. 16/695,597 (29 pages in English).
United States Office Action dated Nov. 25, 2020, in Counterpart U.S. Appl. No. 16/695,597 (19 pages in English).
United States Office Action dated Dec. 15, 2021 in counterpart U.S. Appl. No. 16/695,597 (18 pages in English).

* cited by examiner

ELECTRONIC DEVICE MODULE AND METHOD OF MANUFACTURING THE SAME

CROSS-REFERENCE TO RELATED APPLICATIONS

This application claims the benefit under 35 USC 119(a) of Korean Patent Application Nos. 10-2018-0038279 filed on Apr. 2, 2018, and 10-2018-0062933 filed on May 31, 2018, in the Korean Intellectual Property Office, the entire disclosures of which are incorporated herein by reference for all purposes.

BACKGROUND

1. Field

This application relates to an electronic device module and a method of manufacturing the same.

2. Description of the Background

Recently, in the electronic products market, consumer demand of portable electronic products has increased rapidly, and there has accordingly been demand for small, lightweight electronic components to be provided in portable electronic product systems.

To achieve this, it has been necessary to use a technique for reducing the sizes of individual components, and also, a system-on-chip (SOC) technique which integrates individual components into a single chip, or a system-in-package (SIP) technique which integrates individual components into a single package.

Particularly, in the case of a high frequency electronic device module using a high frequency signal, such as a communications module or a network module, it has been necessary to provide electromagnetic wave shielding structures having various forms to successfully implement shielding properties in relation to electromagnetic wave interference, along with miniaturization.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a substrate, at least one first component and at least one second component disposed on one surface of the substrate, a second sealing portion having the at least one second component embedded therein, and disposed on the substrate, and a first sealing portion disposed outside of the second sealing portion, at least a portion of the first sealing portion being disposed between the at least one first component and the substrate.

The electronic device module may further include a shielding portion disposed on a surface of the second sealing portion.

The electronic device module may further include a ground electrode on the substrate, and a groove formed between the first sealing portion and the second sealing portion, wherein the shielding portion may be disposed in the groove and connected to the ground electrode.

The electronic device module may further include a connection terminal disposed to penetrate through the first sealing portion, wherein the at least one first component may be electrically connected to the substrate through the connection terminal.

The first sealing portion height may be substantially equal to a height of the connection terminal.

The electronic device module may further include an antenna disposed on another surface of the substrate.

The antenna may be disposed in an area opposing an area in which the first sealing portion is disposed.

The electronic device module may further include a third sealing portion disposed on the one surface of the substrate, and having a height greater than a height of the first sealing portion and equal to or less than a height of the second sealing portion.

The electronic device module may further include a fourth sealing portion disposed on the one surface of the substrate and having a second component of the at least one second component embedded therein, the fourth sealing portion being spaced apart from the second sealing portion.

The fourth sealing portion may have a stepped portion of which a height is reduced towards the second sealing portion.

In the fourth sealing portion, a height of a portion adjacent to the second sealing portion may be equal to twice a spaced distance from the second sealing portion or less.

The shielding portion may be extended to a surface of the fourth sealing portion.

In another general aspect, a method of manufacturing an electronic device module includes mounting at least one second component and a connection terminal on one surface of a substrate, forming a sealing portion sealing an overall area of the one surface of the substrate, distinguishing a first sealing portion and a second sealing portion from each other by partially removing an area in which the second component is not disposed in the sealing portion, forming a shielding portion on a surface of the sealing portion, partially removing the first sealing portion to expose the connection terminal, and mounting a first component on the connection terminal.

The method may further include exposing a ground electrode formed on the substrate by removing the sealing portion along a boundary between the first sealing portion and the second sealing portion before the forming the shielding portion.

The exposing the ground electrode may include removing the sealing portion using a laser.

The distinguishing the first sealing portion and the second sealing portion from each other and the exposing the connection terminal may include removing the sealing portion using a grinder.

In another general aspect, an electronic device module includes a first sealing portion disposed on a first surface of a substrate, a second sealing portion disposed on the first surface of the substrate and spaced apart from the first sealing portion, a first electronic component disposed on the first sealing portion and electrically connected to the substrate through the first sealing portion, and a second electronic component embedded in the second sealing portion.

The electronic device module may further include a shielding portion disposed on the second sealing portion and electrically connected to a ground electrode on the substrate, wherein the first sealing portion may be spaced apart from the second sealing portion by the shielding portion.

The electronic device module may further include an antenna disposed on a second surface of the substrate opposing the first sealing portion.

The electronic device module may further include a third sealing portion disposed on the first surface of the substrate, and a third electronic component embedded in the third sealing portion, wherein the shielding portion may be disposed on the third sealing portion, and wherein the second sealing portion may be isolated from the third sealing portion by the shielding portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
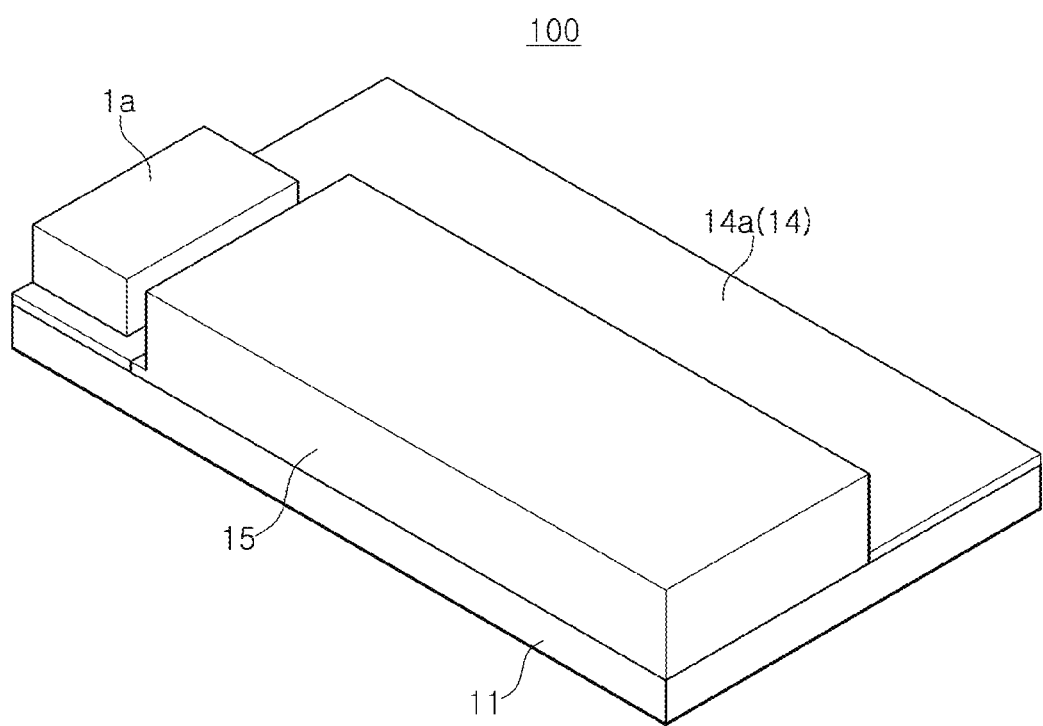
FIG. 1 is a perspective view of an electronic device module according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, means that at least one example exists in which such a feature is included or implemented while all examples are not limited thereto.

An aspect of the present disclosure is to provide an electronic device module in which individual internal components are able to be protected from impacts and which has an electromagnetic wave shielding structure having excellent electromagnetic wave interference resistance properties or electromagnetic wave resistance properties, and a method of manufacturing the same.

Figure 2:
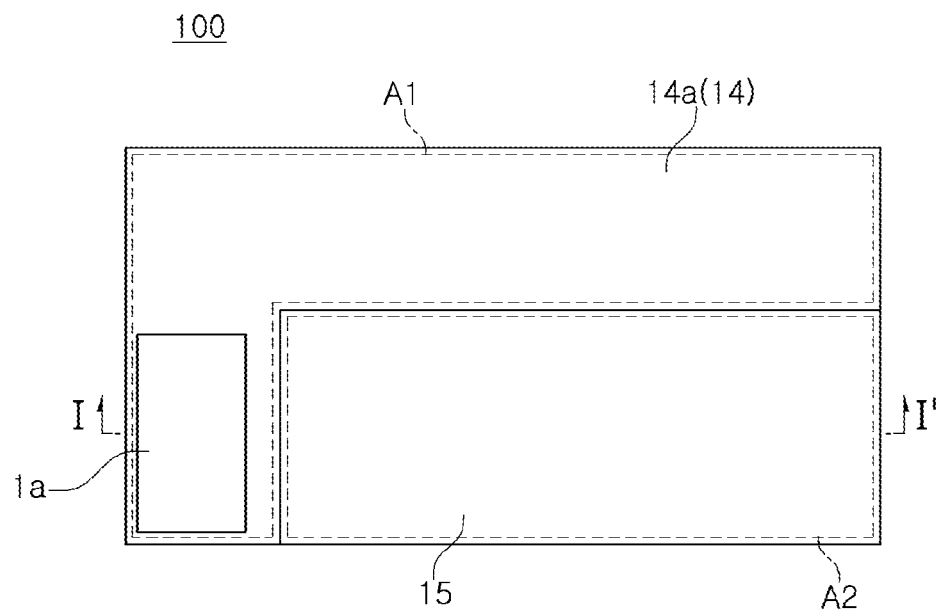
FIG. 2 is a top view of an electronic device module in FIG. 1.
Figure 3:
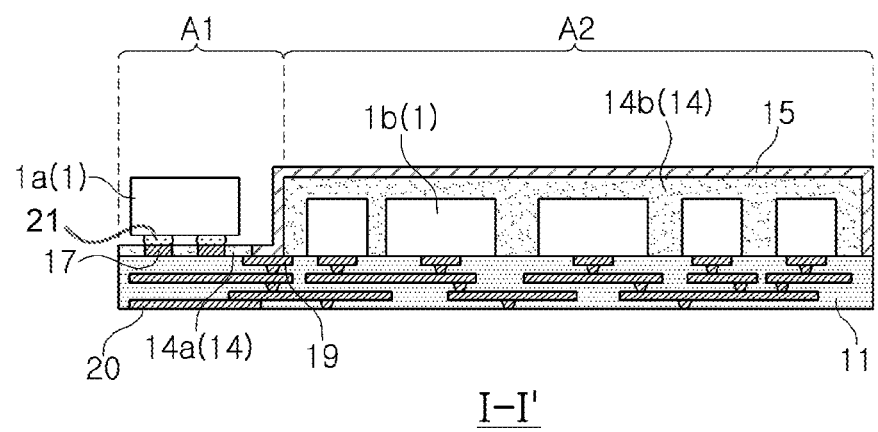
FIG. 3 is a cross-sectional view taken along line I-I' of FIG. 2.

FIG. 1 is a perspective view of an electronic device module according to an example. FIG. 2 is a plan view of an electronic device module in FIG. 1. FIG. 3 is a cross-sectional view taken along line I-I' of FIG. 2.

Referring to FIGS. 1 to 3, an electronic device 100 module may include a substrate 11, electronic components 1, a sealing portion 14, and a shielding portion 15.

On a first surface of the substrate 11, a mounting electrode (not shown) may be disposed to mount the electronic components 1 and a ground electrode 19, and a wiring pattern may be disposed on the first surface in which the mounting electrode may be electrically connected.

On the mounting electrode, at least one electronic component 1 may be mounted.

The ground electrode 19 may be electronically connected to the shielding portion 15.

According to an example, the ground electrode 19 may be disposed between a first component 1a and a second component 1b and contact the shielding portion 15, but examples are not limited thereto. For example, the ground electrode 19 may be formed according to an overall shape of the shielding portion 15 and contact the overall shielding portion 15, or other various modifications may be made.

Also, according to an example, the ground electrode 19 may be formed in solid line form according to a shape of the shielding portion 15. However, embodiments thereof are not limited thereto. The ground electrode 19 may have various forms as long as the ground electrode 19 is able to be connected to the shielding portion 15. For example, the ground electrode 19 may be formed as a broken line or a dotted line.

Although not illustrated in detail, the mounting electrode and/or the ground electrode 19 may be protected by protective insulation layers (not illustrated) disposed in layers on an upper portion, and may be exposed externally of the protective insulation layer through an opening formed in the protective insulation layer. As the substrate 11 configured as above, various types of circuit substrates (e.g., a ceramic substrate, a printing circuit substrate, a flexible substrate, and the like) generally used in the respective technical field may be used. The substrate 11 according to the example may be a multilayer substrate 11 having a plurality of layers, and a circuit pattern may be formed between the layers.

The electronic components 1 may include a variety of electronic devices such as a passive device and an active device. In other words, the electronic components 1 may be implemented by electronic components able to be mounted on or in the substrate 11. In the example, the electronic component is not limited to devices, but may include various components such as a connector.

The electronic components 1 may include at least one second component 1b embedded in the sealing portion 14, and at least one first component 1a exposed to the outside of the sealing portion 14 and not being embedded therein. For example, the first component 1a may be a connector, and the second component 1b may be an electronic device, but they are not limited thereto.

The sealing portion 14 may be disposed on the first surface of the substrate 11 and seal the electronic components 1. The sealing portion 14 may fix the electronic components 1 by sealing the component externally, thereby protecting the electronic components 1 safely from an external impact. However, as described above, the first component 1a may be exposed to the outside of the sealing portion 14, not being embedded in the sealing 14.

The sealing portion 14 according to the example may be formed of an insulation material. For example, the sealing 14 may be formed of a resin material such as an epoxy molding compound (EMC), but is not limited thereto. Also, in an alternative example, the sealing portion 14 may be formed of a conductive material (e.g., a conductive resin, and the like). In this case, an individual sealing member, such as an underfill resin, may be provided between the second component 1b and the substrate 11.

The sealing portion 14 in the embodiments may be divided as a first sealing portion 14a disposed at the outside of the shielding portion 15, and a second sealing portion 14b disposed in the shielding portion 15, which will be described later.

The first sealing portion 14a may be disposed at the outside of the shielding portion 15, and have a thickness less than that of the second sealing portion 14b. Accordingly, a connection terminal 17 formed in the substrate 11 may be exposed externally through the first sealing portion 14a.

In the example, the first component 1a may be mounted on the connection terminal 17. Accordingly, a portion of the first sealing portion 14a may be disposed between the first component 1a and the substrate 11, and the first component 1a may be electrically connected to the substrate 11 through the connection terminal 17.

In the example, the first sealing portion 14a may be disposed along an edge of the substrate. More specifically, the first sealing portion 14a may be disposed along two consecutive edges of the substrate 11 which is a square, but is not limited thereto.

The second sealing portion 14b may be formed to be thicker than the first sealing portion 14a, and the second components 1b may be embedded in the second sealing portion 14b. Accordingly, the height of the second sealing portion 14b may be greater than the height of the second components 1b.

In the example, the second sealing portion 14b may be disposed in an area other than the first sealing portion 14a. Also, the second sealing portion 14b may be formed as a hexahedron, but is not limited thereto.

The first sealing portion 14a and the second sealing portion 14b may be completely separated by the shielding portion 15. However, embodiments thereof are not limited thereto. In an alternative embodiment, the first sealing portion 14a and the second sealing portion 14b may be partially connected to each other.

The shielding portion 15 may be formed along a surface of the second sealing portion 14b, and block electromagnetic waves flowing into the second component 1b from the outside or leaked from the second component 1b to the outside. The shielding area may also be disposed between the first component 1a and the second component 1b and block interference of electromagnetic waves between the first component 1a and the second component 1b. To this end, the shielding portion 15 may be formed of a conductive material, and electrically connected to the ground electrode 19 on the substrate 11.

The shielding portion 15 may be formed by coating an external surface of the second sealing portion 14b with a resin material including a conductive powder or by forming a metal thin film. In the case of forming a metal thin film, various methods, such as a sputtering method, a vapor deposition method, an electroplating process, an electroless plating process, and the like, may be used.

For example, the shielding portion 15 may be a metal thin film formed on an external surface of the second sealing portion 14b by a spray coating method. By the spray coating method, an evenly coated film may be formed, and costs, in terms of infrastructure investment, may be relatively lower than other processes. However, embodiments are not limited thereto. The metal thin film may also be formed using a sputtering method.

An antenna 20 may be disposed on a second surface of the substrate 11 or in the substrate 11. In an example, the antenna 20 may be disposed in a position opposing the first sealing portion 14a between two surfaces of the substrate 11.

In the example, the notion that the antenna 20 is disposed to oppose or face the first sealing portion 14a may indicate that, when the antenna 20 is disposed on the first surface of the substrate 11, the antenna 20 may overlap with the first sealing portion 14a.

In the case in which the antenna 20 is disposed in an area opposing the second sealing portion 14b, a wireless signal transmitted and received via the antenna 20 may be blocked by the shielding portion 15. Therefore, in the example, the antenna 20 may only be disposed on a lower portion of the first sealing portion 14a in which the shielding portion 15 is not present.

However, embodiments thereof are not limited thereto. In the case in which the antenna 20 is configured to radiate a wireless signal to a lower portion of the substrate 11, the antenna may be disposed on a lower portion of the second sealing portion 14b.

For example, in the case in which a dipole antenna which radiates a wireless signal in a direction horizontal to the substrate 11 is disposed, it may be favorable to dispose an antenna on an area opposing the first sealing portion 14a. However, in the case in which a patch antenna which radiates a wireless signal in a lower portion direction among perpendicular directions to the substrate 11 is provided, the antenna may be disposed on an area opposing the second sealing portion 14b.

Also, the antenna 20 may be formed using a circuit pattern formed on the substrate 11. However, embodiments thereof are not limited thereto. For example, an individually manufactured antenna component may be mounted on the second surface of the substrate 11, and other various modifications are also possible.

Thus, the electronic device module according to the example may protect an electronic component mounted on the substrate 11 from an external environment and may readily block electromagnetic waves as well by using the sealing portion 14 and the shielding portion 15 as above.

Also, as the shielding portion 15 is partially disposed on the substrate 11, the antenna 20 may be disposed on an area in which the shielding portion 15 is not formed. Accordingly, the electronic components 1 may be protected while maintaining a radiation performance of the antenna 20.

In the description below, a method of manufacturing an electronic device module according to an example will be described.

Figure 4:
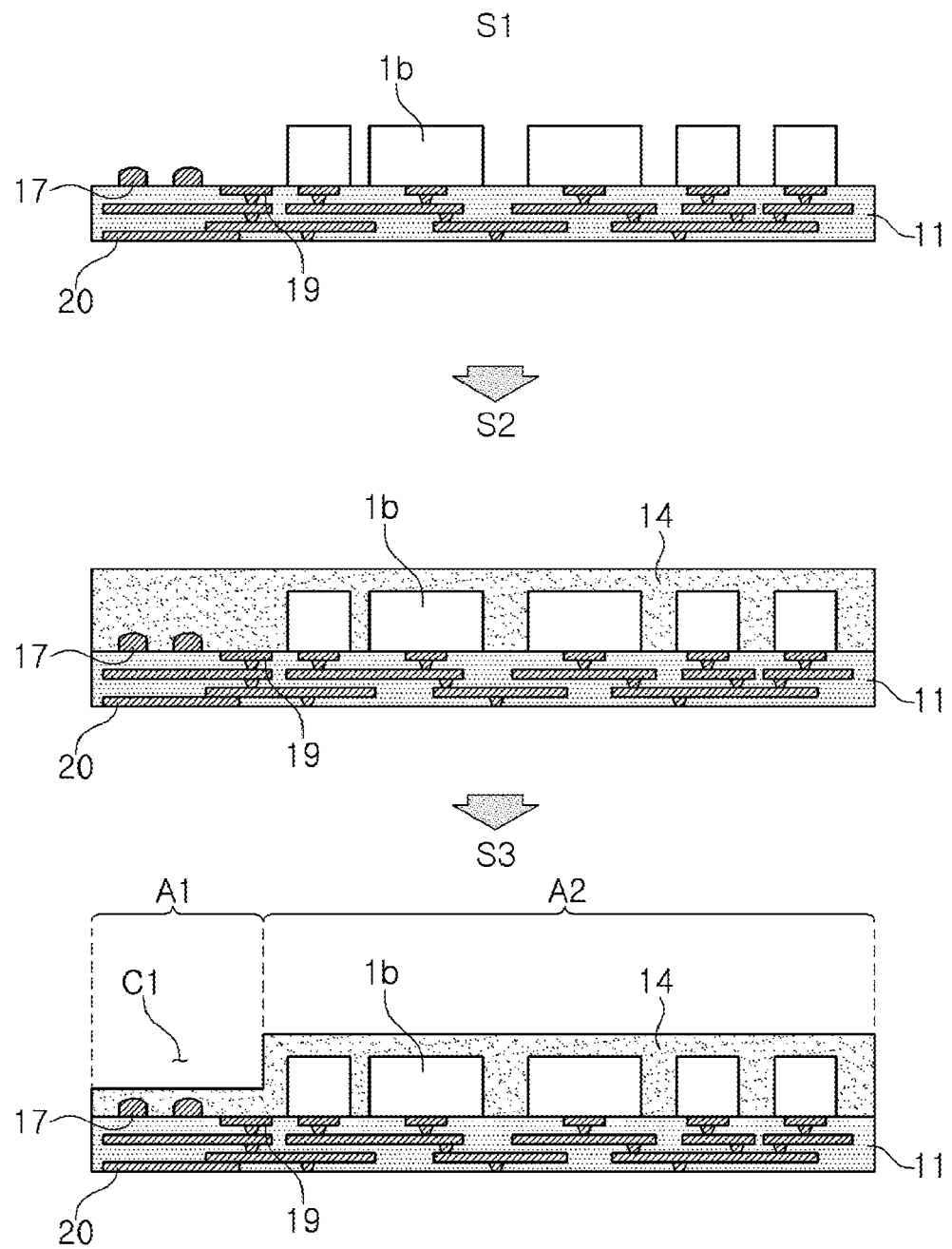
FIGS. 4 and 5 are views illustrating processes in a method of manufacturing an electronic device module in order according to one or more embodiments.
Figure 5:
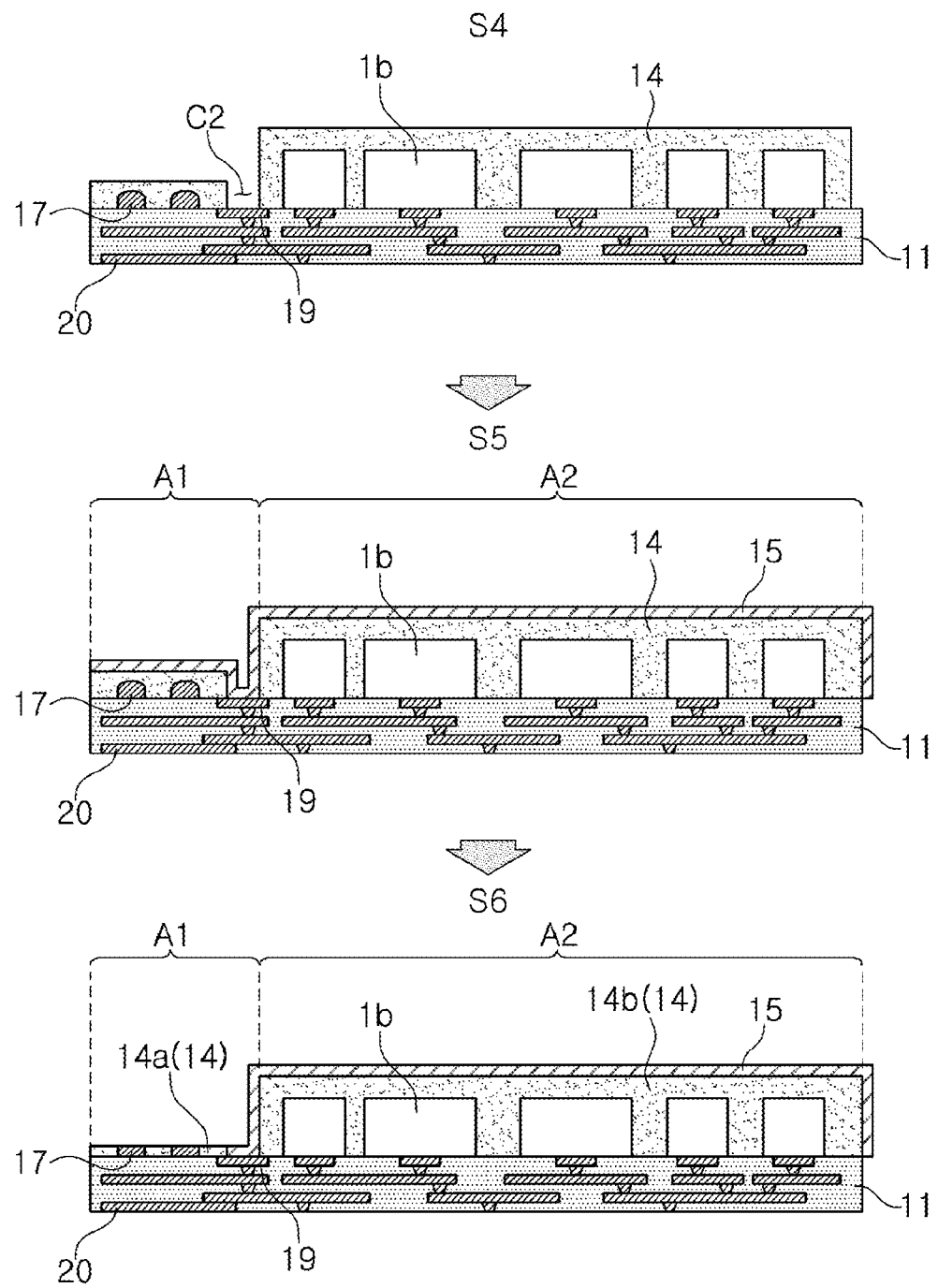

FIGS. 4 and 5 are views illustrating processes in a method of manufacturing an electronic device module in order according to one or more examples.

Referring to FIG. 4, second electronic components 1b and a connection terminal 17 may be mounted on a substrate 11 (S1).

The substrate 11 according to various examples may be a multilayer circuit substrate 11 having a plurality of layers, and electrically connected circuit patterns may be formed between the layers. On an upper surface of the substrate 11, an electrode for mounting a component (mounting electrode), a ground electrode 19, and the like, may be formed.

The second electronic components 1b may be bonded to the substrate 11 by a conductive adhesive such as a solder.

The connection terminal 17 may be formed by coating the mounting electrode with a conductive adhesive such as a solder or a conductive resin. However, embodiments thereof are not limited thereto. For example, the connection terminal 17 may be formed by using an individually manufactured metal bump, a conductive column, or other various modifications.

As a following step, the second electronic components 1b may be sealed, and a sealing portion 14 may be formed on a first surface of the substrate 11 (S2).

The sealing portion 14 may be formed on an overall area of the first surface of the substrate 11. Accordingly, the sealing portion 14 may be formed such that second components 1b as well as the connection terminal 17 are embedded therein. In this process, the sealing portion 14 may be manufactured by a transfer molding method, but is not limited thereto.

Thereafter, a primary removal process in which the sealing portion 14 is partially removed may be undertaken (S3). In this step, an area in which the second component 1b is not disposed may be partially removed.

The area in which the sealing portion 14 is removed may be formed as an empty space (C1). The area in which the sealing portion 14 is removed in this process may be an area (A1; hereinafter, referred to as a first area) described as a first sealing portion (14a in FIG. 2) in an electronic device module. Also, an area in which the sealing portion 14 is not removed may be another area (A2; hereinafter, referred to as a second area) described as a second sealing portion 14b in an electronic device module. Thus, as the sealing portion 14 is removed in this process, the first sealing portion (14a in FIG. 1) and the second sealing portion (14b) may be distinguished from each other.

As the sealing portion 14 in the first area A1 is partially removed, a thickness of the sealing portion 14 in the first area A1 may be formed differently from a thickness of the sealing portion 14 in the second area.

In this process, the sealing portion 14 may be removed by thinning the sealing portion 14. Thus, a grinder (mechanical grinding) may be used to remove the sealing portion 14, but embodiments thereof are not limited thereto.

Also, the sealing portion 14 may be removed within a range in which the connection terminal 17 is not exposed. Accordingly, after the sealing portion 14 in the first area A1 is removed, a thickness of the sealing portion 14 in the first area A1 may be greater than a height of the connection terminal 17.

As a following step, as illustrated in FIG. 5, a secondary removal process may be performed in which the sealing portion 14 disposed on a boundary between the first area A1 and the second area A2 is removed (S4).

Through the secondary removal process, a groove C2 may be formed between the sealing portion 14 in the first area A1 and the sealing portion 14 in the second area A2 in a form of a slit. The groove C2 may be formed to completely remove the sealing portion 14, and accordingly, a contact electrode 19 on the substrate 11 may be exposed externally through the groove C2.

In this step, a laser may be used to remove the sealing portion 14. However, embodiments thereof are not limited thereto. Various means may be used to remove the sealing portion 14 such as a laser, plasma, ion beam, grinder, wire cutter, saw or knife blade used in the sawing or dicing of a module, and the like.

Thereafter, a shielding portion 15 may be formed on a surface of the sealing portion 14 (S5). As described above, the shielding portion 15 may be implemented as a metal thin film. The metal thin film may be formed by applying a sputtering method, a spray coating method, and the like.

However, embodiments thereof are not limited thereto. The shielding portion 15 may be formed by various methods such as a screen-printing method, a painting method, a deposition method, and the like.

In this process, the shielding portion 15 may be coated on an inside of the groove C2 formed between the first area A1 and the second area A2. Accordingly, the shielding portion 15 may be electrically connected to the contact electrode 19 on the substrate 11 through the groove C2.

As a next step, a tertiary removal process may be undertaken in which the shielding portion 15 and the sealing portion 14 formed in the first area A1 are removed (S6). In this process, the shielding portion 15 and the sealing portion 14 may be partially removed using a grinder as above, but embodiments thereof are not limited thereto.

In this process, the sealing portion 14 may be removed until the connection terminal 17 formed on the substrate 11 is exposed. Accordingly, the sealing portion 14 in the first area A1 may be formed as the first sealing portion 14a, and the first sealing portion 14a may have a height equal to that of the connection terminal 17.

Then, the first component 1a may be mounted on the connection terminal 17 exposed to the outside of the first sealing portion 14a, and the electronic device module illustrated in FIG. 3 may be manufactured.

The first component 1a may be bonded to the connection terminal 17 by a conductive adhesive 21 such as a solder.

By using the method of manufacturing an electronic device module according to the examples described above, an electronic device module may be manufactured by forming a sealing portion on an overall area of one surface of a substrate and removing unnecessary portions.

In the case of a comparative example, after all electronic components are mounted on a substrate, a sealing portion is formed only on a certain area using a mold. As a mold frame needs to be disposed between a first component and a second component, a spaced distance between the first component and the second component should be greater than a thickness of the mold frame.

However, by using the methods in the examples of the present disclosure, there may be no need to dispose a mold frame between a first component and a second component, and accordingly, a distance between the first component and the second component may be significantly reduced, and an overall size of an electronic device module may be significantly reduced as well.

Also, in the case of using a mold, different molds need to be prepared corresponding to different types of electronic device modules. However, in the case of using the methods in the examples described herein, an electronic device module may be manufactured by forming a sealing portion using one mold, and processing the sealing portion in a form to correspond to electronic components and shielding portions of the electronic device module. Thus, even if a structure of an electronic device module is changed, the electronic device module may be manufactured without changing a manufacturing facility.

Meanwhile, an electronic device module in the present disclosure is not limited to the embodiments described above, but various embodiments thereof are also possible.

Figure 6:
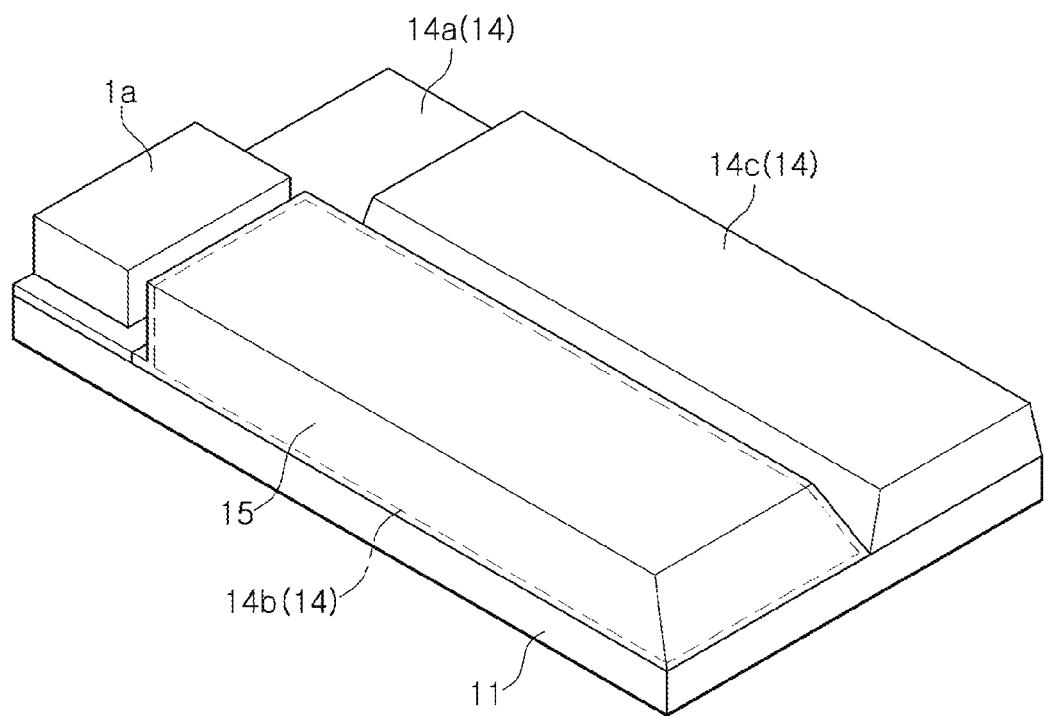
FIG. 6 is a perspective view of an electronic device module according to one or more embodiments.

FIG. 6 is a perspective view of an electronic device module according to various other examples in the present disclosure.

Referring to FIG. 6, an electronic device module according to an example may be configured similarly to the electronic device module in the aforementioned examples (FIGS. 1-5), and may have a third sealing portion 14c, on a surface of which a shielding portion 15 is not formed.

In the example, a thickness of the third sealing portion 14c may be greater than that of a first sealing portion 14a and less than a second sealing portion 14b. However, embodiments thereof are not limited thereto.

In the third sealing portion 14c, electronic components may not be embedded as in the first sealing portion 14a, but in an alternative example, electronic components may be embedded in the third sealing portion 14c.

An antenna formed on a second surface of the substrate 11 may be disposed in an area opposing the third sealing portion 14c.

In the example, at least one of side surfaces of the second sealing portion 14b on which the shielding portion 15 is formed may be formed as a sloping surface.

The configuration, as above, may be derived during the process of forming a groove between the third sealing portion 14c and the second sealing portion 14b using a laser to distinguish the third sealing portion 14c and the second sealing portion 14b from each other.

Thus, the area in which the sealing portion is removed by a laser may be formed as a sloping surface, and the side surface on which the sealing portion is removed by a grinding method, a sawing method, and the like, may be formed as a surface perpendicular to the substrate 11.

In the electronic device module configured as described above in the present disclosure, the sealing portion 14 may be removed to a minimum. Accordingly, a manufacturing time to remove the sealing portion 14 may be significantly reduced.

Figure 7:
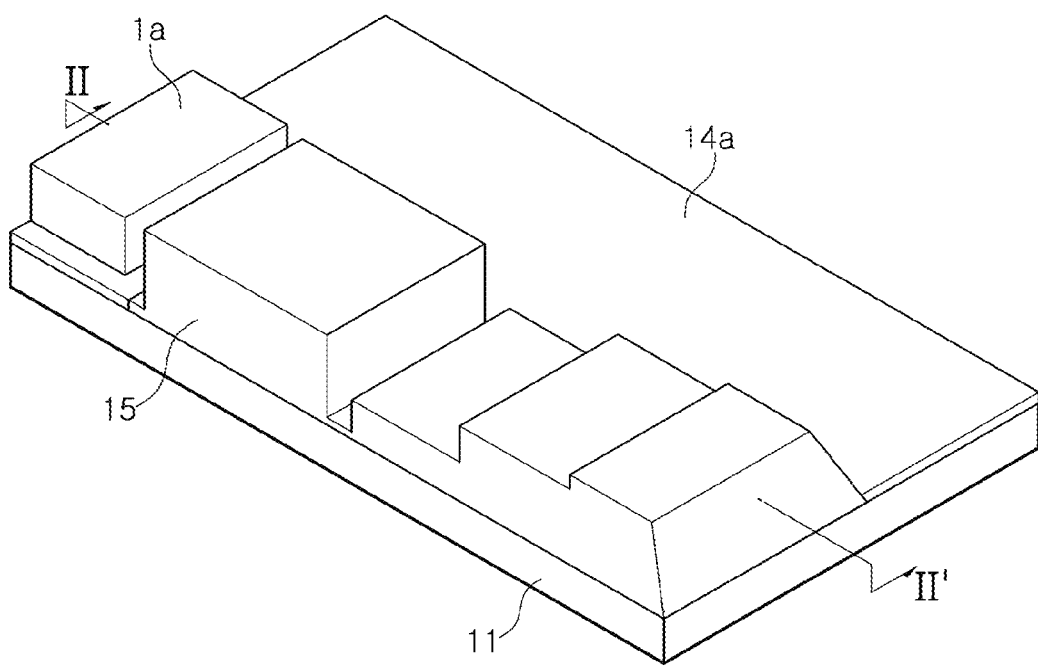
FIG. 7 is a perspective view of an electronic device module according to one or more embodiments.
Figure 8:
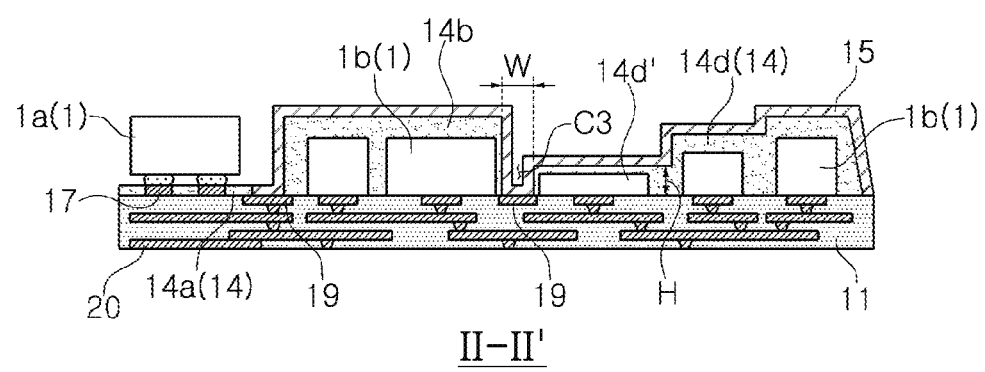
FIG. 8 is a cross-sectional view taken along line II-II' in FIG. 7.

FIG. 7 is a perspective view of an electronic device module according to other various examples in the present disclosure. FIG. 8 is a cross-sectional view taken along line II-II' in FIG. 7.

Referring to FIGS. 7 and 8, the electronic device module according to an example may be configured similarly to the example in FIG. 1, and may include a fourth sealing portion 14d.

In the fourth sealing portion 14d, electronic components 1 may be embedded similarly to the second sealing portion 14b, and the shielding portion 15 may be formed on a surface of the fourth sealing portion 14d. Thus, the shielding portion 15 may be disposed over the overall surfaces of the second sealing portion 14b and the fourth sealing portion 14d. The shielding portion 15 formed on the second sealing portion 14b and the shielding portion 15 formed on the fourth sealing portion 14d may be connected to each other and integrated as a single component.

In the fourth sealing portion 14d, the portion adjacent to the second sealing portion 14b may have a lowest thickness, and the further the fourth sealing portion 14d is from the second sealing portion 14b, the greater to which the thickness of the fourth sealing portion 14d may be formed. Accordingly, the fourth sealing portion 14d may have at least one stepped portion. However, embodiments thereof are not limited thereto. For example, an upper surface of the fourth sealing portion 14d may be formed as a sloping surface, or other various modifications are also possible.

To this end, in the case of the electronic components 1b embedded in the fourth sealing portion 14d, the components having a lower height may be mounted in a closer position to the second sealing portion 14b, and the higher the mounted position, the further the components may be mounted from the second sealing portion 14b.

The second sealing portion 14b may be spaced apart from the fourth sealing portion 14d with a certain gap. Accordingly, a spaced portion C3, an empty space having a form of a slit, may be disposed between the second sealing portion 14b and the fourth sealing portion 14d. Through the spaced portion C3, a ground electrode 19 on the substrate 11 may be exposed to the outside of the sealing portion 14.

The shielding portion 15 may be disposed in the spaced portion C3 as well. Accordingly, the shielding portion 15 may be connected to the ground electrode 19 in the spaced portion C3. A width of the spaced portion C3 may need to be formed to be as narrow as possible to reduce an overall size of the electronic device module. However, the narrower and deeper the width of the spaced portion C3, the more difficult for the shielding portion to be intruded to the spaced portion C3.

In this case, the shielding portion 15 may not be completely coated to an overall area of the spaced portion C3, and accordingly, contact reliability between the shielding portion 15 and the contact electrode 19 may be degraded. Also, it may be difficult to completely block a flow of electromagnetic waves between the electronic components 1b disposed in the second sealing portion 14b and the electronic components 1b disposed in the fourth sealing portion 14d.

Thus, in the examples, in the fourth sealing portion 14d, a height of a portion (14d'; hereinafter, referred to as a lower end) adjacent to the spaced portion C3 may be configured to be low for the shielding portion 15 to be easily intruded to the spaced portion C3. For example, the height (H; a depth of the spaced portion C3) of the lower end 14d' may be configured to be equal to twice a width (W) of the spaced portion C3 or less. However, embodiments thereof are not limited thereto.

As set forth above, in the electronic device module in the examples disclosed herein, as a shielding portion is not formed in an area of a substrate in which an antenna is formed, electronic components may be protected from electromagnetic waves while maintaining radiation performance of an antenna.

Also, in the case of the method of manufacturing an electronic device module according to the examples disclosed herein, a mold frame may not need to be disposed between a first component and a second component. Accordingly, a distance between the first component and the second component may be significantly reduced, and an overall size of an electronic device module may be significantly reduced as well.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
   a substrate;
   at least one first component and at least one second component disposed on one surface of the substrate;
   a sealing portion comprising a first sealing portion and a second sealing portion, wherein the first sealing portion and the second sealing portion are separated by a shielding portion,
   wherein the second sealing portion has the at least one second component embedded therein, and disposed on the substrate,
   wherein the first sealing portion is disposed outside of the second sealing portion, between the at least one first component and the substrate; and
   a connection terminal disposed to penetrate through the first sealing portion,
   wherein the at least one first component is bonded to the connection terminal by a conductive adhesive,
   wherein the sealing portion comprises an insulation material, and
   wherein a top surface of the first sealing portion and a top surface of the shielding portion disposed between the first sealing portion and the second sealing portion are a same distance from the one surface of the substrate.

2. The electronic device module of claim 1, further comprising a shielding portion disposed on a surface of the second sealing portion.

3. The electronic device module of claim 1, wherein the at least one first component is electrically connected to the substrate through the connection terminal.

4. The electronic device module of claim 3, wherein the first sealing portion height is substantially equal to a height of the connection terminal.

5. The electronic device module of claim 1, further comprising:
   an antenna disposed on another surface of the substrate.

6. The electronic device module of claim 5, wherein the antenna is disposed in an area opposing an area in which the first sealing portion is disposed.

7. The electronic device module of claim 1, further comprising a third sealing portion disposed on the one surface of the substrate, and having a height greater than a height of the first sealing portion and equal to or less than a height of the second sealing portion.

8. The electronic device module of claim 2, further comprising:
   a ground electrode on the substrate,
   wherein the shielding portion is connected to the ground electrode
   where the shielding portion separates the first sealing portion from the second sealing portion.

9. The electronic device module of claim 8, wherein the top surface of the shielding portion between the first sealing portion and the second sealing portion is coplanar with the top of the first sealing portion.

10. The electronic device module of claim 4, wherein the at least one first component is separated from the first sealing portion by a height of the conductive adhesive.

11. The electronic device module of claim 2, further comprising a fourth sealing portion disposed on the one surface of the substrate, and having a second component of the at least one second component embedded therein, the fourth sealing portion being spaced apart from the first sealing portion and the second sealing portion.

12. The electronic device module of claim 11, wherein the fourth sealing portion has a stepped portion of which a height is reduced towards the second sealing portion.

13. The electronic device module of claim 11, wherein, in the fourth sealing portion, a height of a portion adjacent to the second sealing portion is equal to twice a spaced distance from the second sealing portion or less.

14. The electronic device module of claim 11, wherein the shielding portion is extended to a surface of the fourth sealing portion.

15. An electronic device module comprising:
- a sealing portion comprising a first sealing portion and a second sealing portion, wherein the first sealing portion and the second sealing portion are separated by a shielding portion;
- a first electronic component disposed on a conductive adhesive on a connection terminal disposed to penetrate through the first sealing portion and electrically connected to the substrate through the first sealing portion; and
- a second electronic component embedded in the second sealing portion,
- wherein the sealing portion comprises an insulation material, and
- wherein a top surface of the first sealing portion and a top surface of the shielding portion disposed between the first sealing portion and the second sealing portion are a same distance from the one surface of the substrate.

16. The electronic device module of claim 15, further comprising a shielding portion disposed on the second sealing portion and electrically connected to a ground electrode on the substrate,
- wherein the shielding portion separates the first sealing portion from the second sealing portion.

17. The electronic device module of claim 16, further comprising an antenna disposed on a second surface of the substrate opposing the first sealing portion.

18. The electronic device module of claim 15, further comprising:
- a third sealing portion disposed on the first surface of the substrate; and
- a third electronic component embedded in the third sealing portion,
- wherein the shielding portion is disposed on the third sealing portion, and
- wherein the second sealing portion is isolated from the third sealing portion by the shielding portion.

* * * * *